(12) United States Patent
Kim et al.

(10) Patent No.: US 12,113,087 B2
(45) Date of Patent: Oct. 8, 2024

(54) IMAGE SENSOR PACKAGE

(71) Applicant: SAMSUNG ELECTRONICS CO., LTD., Suwon-si (KR)

(72) Inventors: Ji-hwang Kim, Cheonan-si (KR); Jong-bo Shim, Asan-si (KR); Sang-uk Han, Gyeonggi-do (KE); Cha-jea Jo, Yongin-si (KR); Won-il Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/127,110

(22) Filed: Mar. 28, 2023

(65) Prior Publication Data

US 2023/0238417 A1    Jul. 27, 2023

Related U.S. Application Data

(63) Continuation of application No. 17/202,702, filed on Mar. 16, 2021, now Pat. No. 11,637,140, which is a
(Continued)

(30) Foreign Application Priority Data

Nov. 23, 2016   (KR) .................. 10-2016-0156595

(51) Int. Cl.
*H01L 27/146*   (2006.01)

(52) U.S. Cl.
CPC .... *H01L 27/14634* (2013.01); *H01L 27/1462* (2013.01); *H01L 27/14636* (2013.01); *H01L 27/14638* (2013.01)

(58) Field of Classification Search
CPC ................................. H01L 27/14634
See application file for complete search history.

(56) References Cited

U.S. PATENT DOCUMENTS

| 6,882,020 | B2 | 4/2005 | Kobayashi et al. |
| 7,061,106 | B2 | 6/2006 | Yang et al. |
(Continued)

FOREIGN PATENT DOCUMENTS

| JP | 2013-051432 A | 3/2013 |
| JP | 2016-051726 A | 4/2016 |
(Continued)

OTHER PUBLICATIONS

Chinese Office Action dated Nov. 23, 2022.
Korean Office Action dated Apr. 25, 2023, for corresponding Patent Application No. 10-2016-0156595.

*Primary Examiner* — Tony Ko
(74) *Attorney, Agent, or Firm* — Muir Patent Law, PLLC

(57) ABSTRACT

An image sensor package includes an image sensor chip on a package substrate, a logic chip on the package substrate and perpendicularly overlapping the image sensor chip, and a memory chip on the package substrate and perpendicularly overlapping the image sensor chip and logic chip. The logic chip processes a pixel signal output from the image sensor chip. The memory chip is electrically connected to the image sensor chip through a conductive wire and stores at least one of the pixel signal from the image sensor chip or a pixel signal processed by the logic chip. The memory chip receives the pixel signal output from the image sensor chip through the conductive wire and receives the pixel signal processed by the logic chip through the image sensor chip and the conductive wire.

20 Claims, 15 Drawing Sheets

Related U.S. Application Data continuation of application No. 15/636,801, filed on Jun. 29, 2017, now Pat. No. 10,971,535.

(56) References Cited

U.S. PATENT DOCUMENTS

| | | |
|---|---|---|
| 7,402,901 B2 | 7/2008 | Hatano et al. |
| 7,709,872 B2 | 5/2010 | Shiau et al. |
| 7,833,818 B2 | 11/2010 | Shih |
| 8,134,192 B2 | 3/2012 | Shih |
| 8,410,603 B2 | 4/2013 | Bae |
| 8,653,660 B2 | 2/2014 | Bae |
| 8,773,562 B1 | 7/2014 | Fan |
| 8,884,416 B2 | 11/2014 | Lee et al. |
| 8,956,916 B2 | 2/2015 | Haba et al. |
| 9,076,789 B2 | 7/2015 | Alba et al. |
| 9,143,710 B2 | 9/2015 | Lee et al. |
| 9,209,161 B2 | 12/2015 | Jung |
| 9,343,497 B2 | 5/2016 | Cho |
| 9,607,972 B2 | 3/2017 | Iwafuchi et al. |
| 11,290,652 B2 | 3/2022 | Nishi |
| 2007/0010042 A1 | 1/2007 | Li |
| 2009/0166887 A1 | 7/2009 | Upadhyayula et al. |
| 2011/0228464 A1 | 9/2011 | Guzek et al. |
| 2013/0256916 A1 | 10/2013 | Kwon et al. |
| 2014/0042298 A1 | 2/2014 | Wan et al. |
| 2014/0117430 A1 | 5/2014 | Lee et al. |
| 2016/0056196 A1 | 2/2016 | Li et al. |
| 2016/0155723 A1 | 6/2016 | Lou |
| 2016/0178749 A1 | 6/2016 | Lin et al. |
| 2016/0255296 A1 | 9/2016 | Iwabuchi et al. |
| 2016/0373629 A1 | 12/2016 | Jung et al. |
| 2019/0181112 A1 | 6/2019 | Hu |
| 2019/0214423 A1 | 7/2019 | Kim et al. |
| 2020/0058518 A1 | 2/2020 | Hsieh |

FOREIGN PATENT DOCUMENTS

| | | |
|---|---|---|
| KR | 10-2004-0027351 A | 4/2004 |
| KR | 10-2006-0122767 | 11/2006 |
| KR | 10-2012-0005341 | 1/2012 |
| KR | 10-1210052 | 12/2012 |
| KR | 10-2013-0015393 | 2/2013 |
| KR | 10-2015-0008853 A | 1/2015 |
| KR | 10-1545951 | 8/2015 |

IMAGE SENSOR PACKAGE

CROSS-REFERENCE TO RELATED APPLICATIONS

This is a continuation application based on pending application Ser. No. 17/202,702, filed Mar. 16, 2021, which in turn is a continuation of application Ser. No. 15/636,801, filed Jun. 29, 2017, now U.S. Pat. No. 10,971,535 B2, issued Apr. 6, 2021, the entire contents of both being hereby incorporated by reference.

Korean Patent Application No. 10-2016-0156595, filed on Nov. 23, 2016, and entitled, "Image Sensor Package," is incorporated by reference herein in its entirety.

BACKGROUND

1. Field

One or more embodiments described herein relate to an image sensor package.

2. Description of the Related Art

Image sensors are used in a variety of electronic devices. Examples include digital cameras, cameras for mobile phones, portable camcorders, and cameras mounted on automobiles, security devices, and robots. The sizes of these devices have gotten smaller over the years in order to meet consumer demand and convenience. This has created a trend in the industry to increase the integration of semiconductor devices, including image sensors.

SUMMARY

In accordance with one or more embodiments, an image sensor package includes an image sensor chip on a package substrate; a logic chip on the package substrate and perpendicularly overlapping the image sensor chip, the logic chip to process a pixel signal output from the image sensor chip; and a memory chip on the package substrate, perpendicularly overlapping the image sensor chip and the logic chip, and electrically connected to the image sensor chip through a conductive wire, the memory chip to store at least one of the pixel signal output from the image sensor chip and a pixel signal processed by the logic chip, wherein the memory chip is to receive the pixel signal output from the image sensor chip through the conductive wire and is to receive the pixel signal processed by the logic chip through the image sensor chip and the conductive wire.

In accordance with one or more other embodiments, an image sensor package includes an image sensor chip on a package substrate; a logic chip on the package substrate and perpendicularly overlapping the image sensor chip, the logic chip to process a pixel signal output from the image sensor chip; and a memory chip structure including a memory chip on the package substrate and perpendicularly overlapping the image sensor chip and the logic chip, the memory chip to store at least one of the pixel signal output from the image sensor chip and a pixel signal processed by the logic chip, wherein the memory chip is electrically connected to the image sensor chip via a first conductive wire and wherein: the image sensor chip and the logic chip are to receive a power supply voltage, a ground voltage, or signals from an external apparatus through a conductive wire that connects the image sensor chip to the package substrate, and the memory chip is to receive the power supply voltage, the ground voltage, or the signals through the package substrate, and to receive the power supply voltage, the ground voltage, or the signals input to the memory chip without passing through the image sensor chip.

In accordance with one or more other embodiments, an image sensor package includes a memory chip structure on a package substrate and including a memory chip; an image sensor chip stacked on the memory chip structure, connected to the package substrate via a first conductive wire, and connected to the memory chip structure via a second conductive wire; and a logic chip between the memory chip structure and the image sensor chip and electrically connected to an interconnection structure of the image sensor chip via through silicon vias passing through at least part of the image sensor chip, the logic chip to process a pixel signal output from the image sensor chip, wherein the memory chip is to receive at least one of the pixel signal output from the image sensor chip and a pixel signal processed by the logic chip via the second conductive wire.

In accordance with one or more other embodiments, a package includes a logic chip; a memory chip; an image sensor chip; an interconnection layer; and a wire to electrically connect the memory chip to the image sensor chip, wherein the logic chip, the memory chip, and the image sensor chip are in a stacked configuration, wherein the logic chip is electrically connected to the memory chip, and wherein the memory chip is to receive a signal from the image sensor chip through the interconnection layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
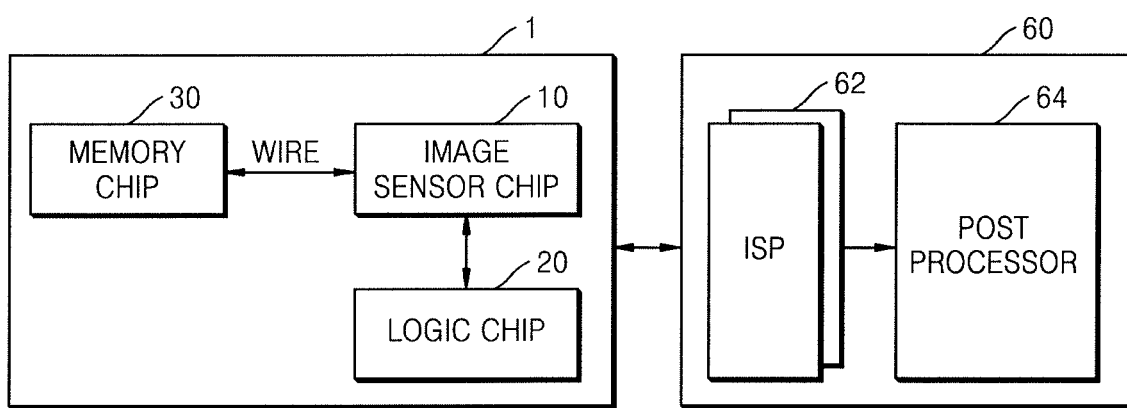
FIG. 1 illustrates an embodiment of an image sensor package.
Figure 5:
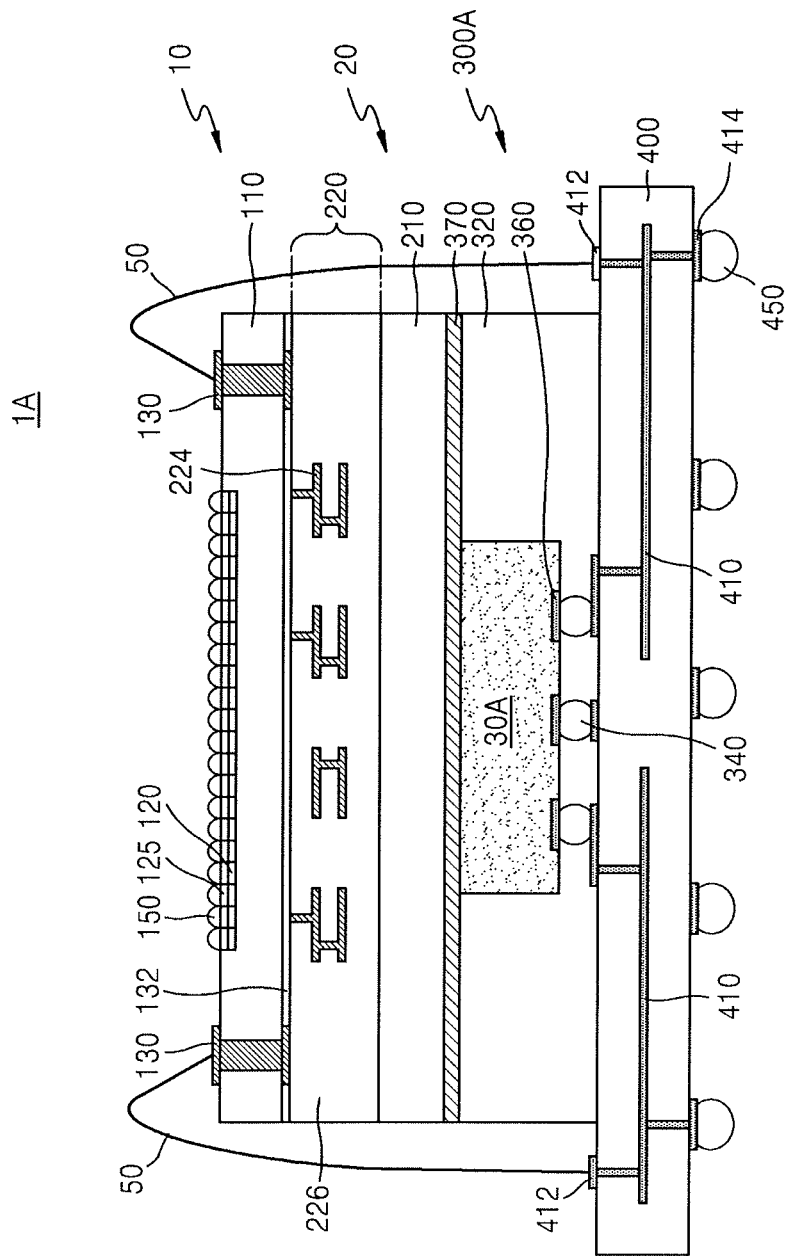
FIG. 5 illustrates another embodiment of an image sensor package.

FIG. 1 illustrates an embodiment of an image sensor package 1 which may include an image sensor chip 10, a logic chip 20, and a memory chip 30. In some embodiments, the image sensor chip 10, the logic chip 20, and the memory chip 30 may be mounted on a package substrate and overlap perpendicularly an extension direction of the package substrate. One example of the package substrate is illustrated in FIG. 5. Also, in one embodiment, the image sensor package 1 includes a complementary metal oxide semiconductor (CMOS) image sensor (CIS).

The image sensor chip 10 may include a pixel array including a plurality of unit pixels and may output a pixel signal. The logic chip 20 may process the pixel signal output from the image sensor chip 10. The memory chip 30 may store at least one of the pixel signal processed by the logic chip 20 and the pixel signal output from the image sensor chip 10.

The image sensor package 1 may connect the memory chip 30 and the image sensor chip 10 electrically to each other through a conductive wire. The logic chip 20 may perpendicularly overlap the memory chip 30 and the image sensor chip 10, and may be between the memory chip 30 and the image sensor chip 10. The logic chip 20 may be electrically connected to the image sensor chip 10 through silicon vias (TSVs) that pass through at least a part of the image sensor chip 10, and may be electrically connected to the memory chip 30 through the TSVs of the image sensor chip 10 and the conductive wire.

The memory chip 30 may receive the pixel signal output from the image sensor chip 10 via the conductive wire. Also, the memory chip 30 may receive the pixel signal processed by the logic chip 20 via the image sensor chip 10 and the conductive wire.

For example, as illustrated in FIG. 5, the image sensor chip 10 and the logic chip 20 may be electrically connected to the memory chip 30 via the conductive wire (e.g., 50 in FIG. 5) and an interconnection layer (e.g., 410 in FIG. 5) in the package substrate. In one embodiment, the image sensor chip 10 and the logic chip 20 may be electrically connected to the memory chip 30 via the conductive wire (e.g., 52 in FIG. 9) and a redistribution structure (e.g., 310 in FIG. 9) of the memory chip 30.

In the image sensor package 1, a power supply voltage, a ground voltage or signals from an external apparatus may be transmitted to an internal interconnection of the package substrate, and then may be input to the image sensor chip 10 and to the logic chip 20 via the image sensor chip 10. In some embodiments, the power supply voltage, the ground voltage or signals from the external apparatus may be transmitted to the internal interconnection of the package substrate, and then may be supplied to the memory chip 30 without passing through the image sensor chip 10.

The image sensor chip 10 may receive the power supply voltage, the ground voltage, or the signals from the external apparatus, for example, through the conductive wire that connects the package substrate to the image sensor chip 10. The power supply voltage, the ground voltage, or the signals may be supplied to the memory chip 30 without passing through the conductive wire that connects the package substrate to the image sensor chip 10. For example, as illustrated in FIG. 5, the power supply voltage, the ground voltage, or the signals may be supplied to the memory chip 30 via the interconnection layer (e.g., 410 in FIG. 5) in the package substrate (e.g., 400 in FIG. 5).

Figure 9:
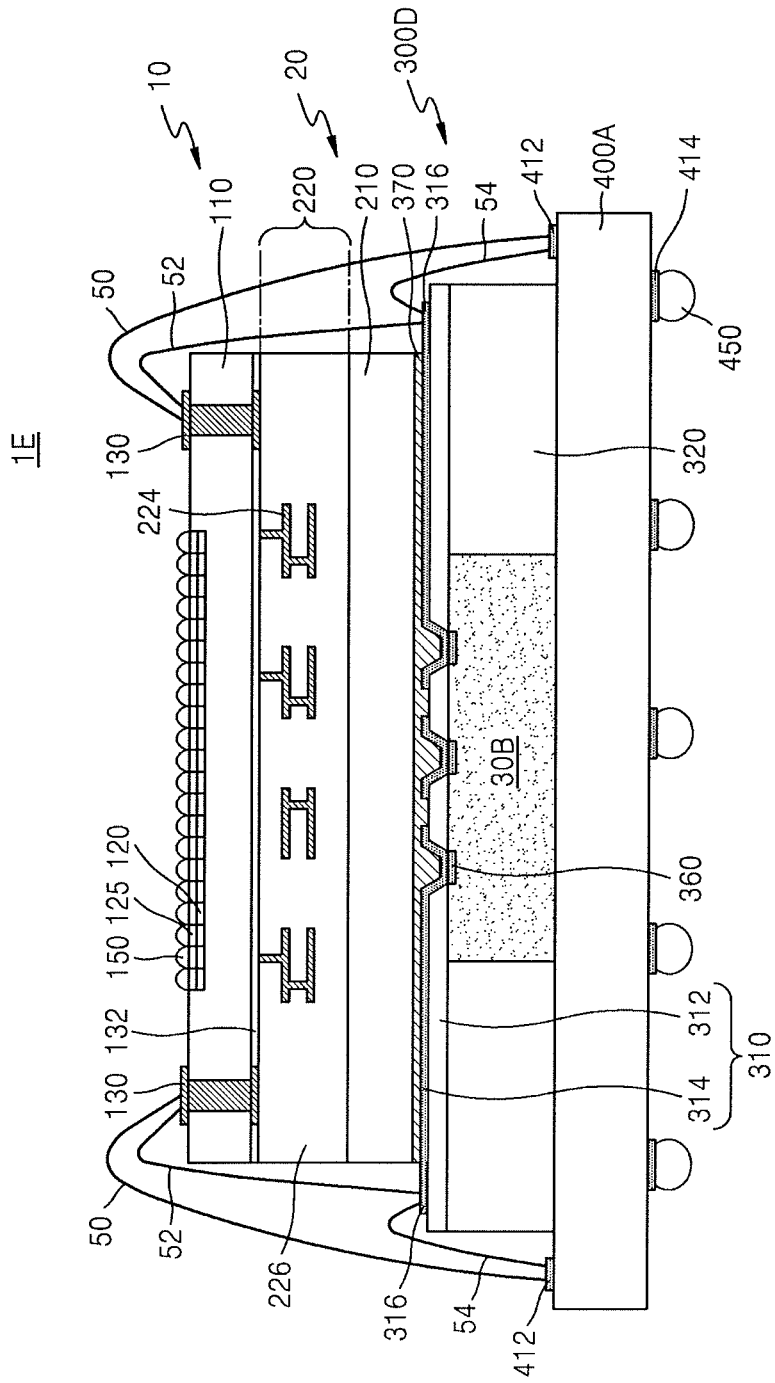
FIG. 9 illustrates another embodiment of an image sensor package.

In one embodiment, as illustrated in FIG. 9, the power supply voltage, the ground voltage, or the signals may be supplied to the memory chip 30 via the redistribution structure (e.g., 310 of FIG. 9) of the memory chip 30 and the conductive wire (e.g., 54 of FIG. 9) that connects the redistribution structure to the package substrate (e.g., 400A of FIG. 9).

The power supply voltage, the ground voltage, or the signals from the external apparatus may be supplied to the logic chip 20 via the image sensor chip 10. For example, the power supply voltage, the ground voltage, or the signals may first be input to an interconnection structure of the image sensor chip 10, via the conductive wire that connects the package substrate to the image sensor chip 10, pass through at least a part of the image sensor chip 10, and supplied to the logic chip 20 via the TSVs connected to the interconnection structure of the image sensor chip 10 and an interconnection structure of the logic chip 20.

Figure 3A:
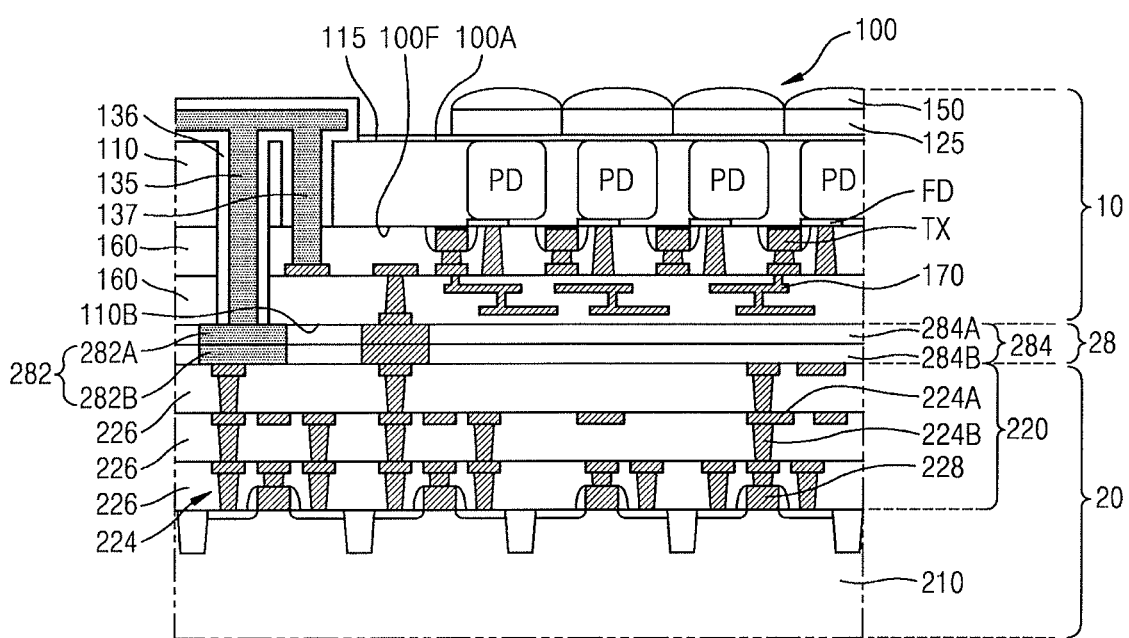
FIG. 3A illustrates an embodiment in which the image sensor chip and a logic chip are combined in the image sensor package.
Figure 3B:
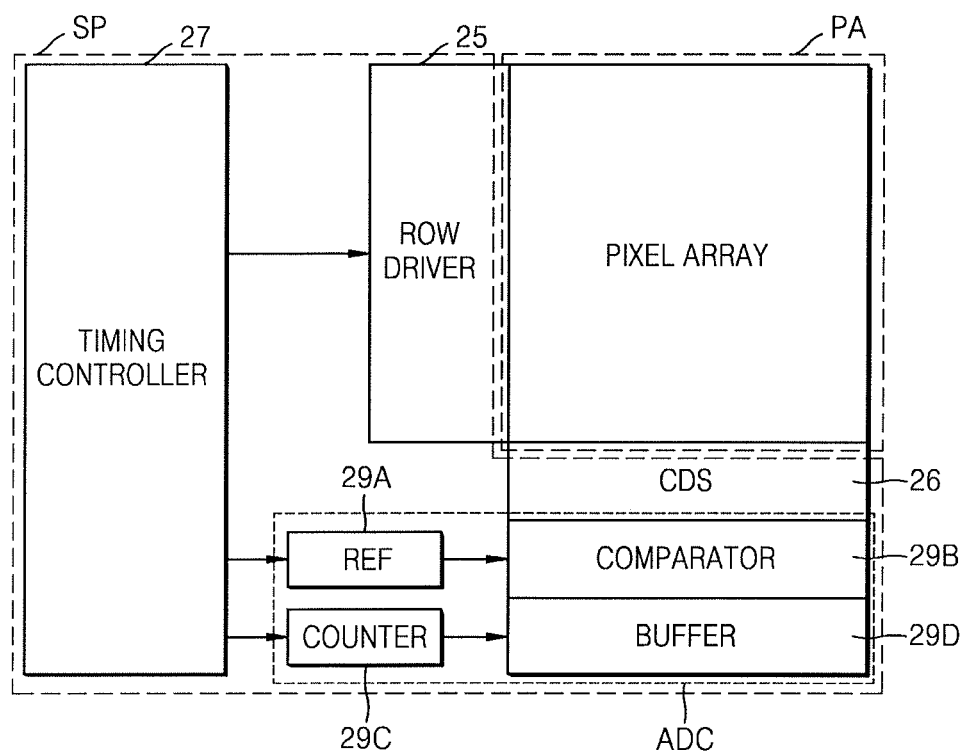
FIG. 3B illustrates an embodiment of a pixel array of the image sensor chip and a signal processor of a logic chip in the combined structure in FIG. 3A.

The logic chip 20 may include a plurality of analog-to-digital converters (ADCs), for example, as illustrated in FIG. 3B. A pixel signal output from the pixel array of the image sensor chip 10 may be transmitted to and processed by the ADCs in the logic chip 20. The pixel signal processed by the logic chip 20 may be written in a memory cell array (MCA) of the memory chip 30, for example, MCA in FIG. 4.

The pixel signal processed by the logic chip 20 may be transmitted to an image processor 60. The image processor 60 may include at least one image signal processor (ISP) 62 and a post processor 64. The image processor 60 may output images captured by the image sensor chip 10 as a preview on a display. When a capture instruction is input by a user or device, the images captured by the image sensor chip 10 may be stored in a memory chip 30.

The post processor 64 may perform various operations to provide a digital image signal from the images captured by the image sensor chip 10. For example, various post processing algorithms may be executed by the post processor 64. Examples of the post processing algorithms included but are not limited to contrast enhancement, sharpness enhancement, noise reduction, or other operations not performed by the ISP 62. An output from the post processor 64 may be supplied by a video codec processor. An image processed by the video codec processor may be output to the display or stored in the memory chip 30.

When a logic chip includes TSVs that electrically connect an image sensor chip to a memory chip to each other, cost incurred by a process of forming TSVs may be increased. Also, the degree of freedom of design may be deteriorated. However, in accordance with one or more embodiments, image sensor package 1 may have a multi-level stack structure in which chips performing various functions are vertically stacked. As a result, the image sensor package 1 may have a small form factor, may establish interconnection comparatively easily through wire bonding, and may achieve an improved degree of freedom of design.

Furthermore, in accordance with one or more embodiments, the power supply voltage, the ground voltage, or the signals supplied from an external apparatus may be supplied directly to the memory chip 30, without passing through the image sensor chip 10. As a result, the image sensor package 1 may have improved power integrity (PI).

Figure 2A:
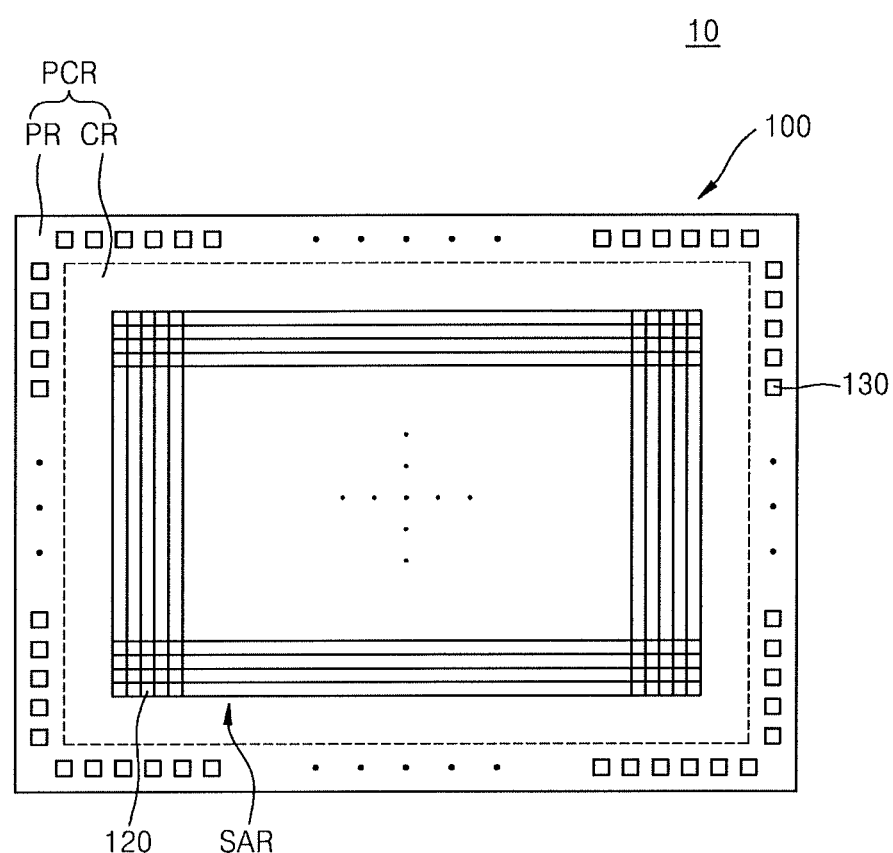
FIG. 2A illustrates an embodiment of an image sensor.
Figure 2B:
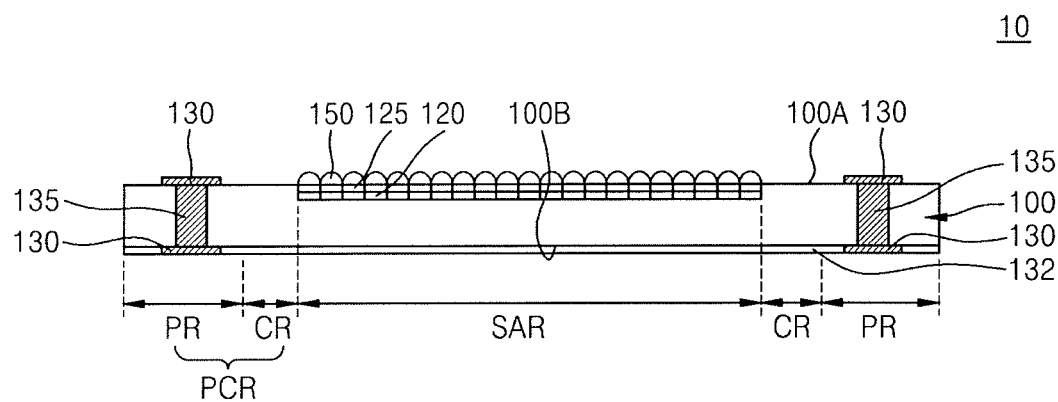
FIG. 2B illustrates a cross-sectional view of the image sensor.

FIG. 2A illustrate an embodiment of an image sensor 100 of the image sensor chip 10 in the image sensor package 1, and FIG. 2B is a cross-sectional view of the image sensor 100 in FIG. 2A.

Referring to FIGS. 2A and 2B, the image sensor 100 may include a sensor array region (SAR), a circuit region (CR), and a pad region (PR). The image sensor 100 may be a CIS or charge-coupled device (CCD). A pixel array including a plurality of unit pixels 120 in a matrix may be formed in the SAR. The CR may be along edges of the SAR. In another embodiment, the CR may perpendicularly overlap a lower part of the SAR. The CR may include cell devices having a plurality of transistors. The CR may include an interconnection structure for supplying predetermined signals to the unit pixels 120 of the SAR and/or for controlling an output signal.

The unit pixels 120 may be, for example, a passive pixel sensor or an active pixel sensor. The unit pixels 120 may include a photodiode that senses light, a transfer transistor that transfers charges produced by the photodiode, a floating diffusion region to store the transferred charges, a reset transistor that periodically resets the floating diffusion region, and a source follower that buffers a signal corresponding to the charges charged in the floating diffusion region.

A plurality of conductive pads 130 may be formed to transmit/receive electrical signals to/from an external apparatus or a package substrate. The PR may be around the SAR. The conductive pads 130 may be electrically connected to the unit pixels 120. The conductive pads 130 may be formed, for example, of a metal, a metal nitride, or a combination thereof. The image sensor 100 may have a plurality of interconnection structures, in which the conductive pads 130, electronic devices in the CR, and the unit pixels 120 in the SAR are electrically connected to one another. The interconnection structures may be formed of a metal, a metal oxide, or a combination thereof. The CR and the PR may constitute a peripheral circuit region (PCR) of the image sensor 100.

As illustrated in FIG. 2B, the image sensor 100 may have a first surface 100A and a second surface 100B that face each other. The unit pixels 120 may be at the first surface 100A of the image sensor 100. A plurality of color filters 125 and a plurality of micro-lenses 150 may be sequentially formed on the unit pixels 120.

The color filters 125 may include, for example, a red (R) filter, a blue (B) filter, and a green (G) filter. In one embodiment, the color filters 125 may include a cyan (C) filter, a yellow (Y) filter, and a magenta (M) filter. A color filter 125, that is one of the R filter, the B filter, or the G filter, or one of the C filter, the Y filter, or the M filter, may be formed in the unit pixels 120. The unit pixels 120 may detect components of incident light that are separated from each other to realize one color.

The micro-lenses 150 may concentrate incident light in the SAR on the unit pixels 120. When the unit pixels 120 include a photodiode, the micro-lenses 150 may concentrate incident light in the SAR on the photodiode of the unit pixels 120.

The image sensor 100 may include a plurality of conductive pads 130 and a plurality of TSVs 135. The conductive pads 130 are on the first surface 100A and the second surface 100B of the image sensor 100. The TSVs 135 pass through the image sensor 100 and electrically connect the conductive pads 130 on the first and second surfaces 100A and 100B. For example, the TSVs 135 may have at least one of a via-first structure, a via-middle structure, or a via-last structure.

The TSVs 135 may include a metal plug and a conductive barrier layer that surrounds the metal plug. The metal plug may include, for example, copper (Cu) or tungsten (W). For example, the metal plug may include Cu, CuSn, CuMg, CuNi, CuZn, CuPd, CuAu, CuRe, CuW, W, or a W alloy. In one embodiment, for example, the metal plug may include at least one of aluminum (Al), gold (Au), beryllium (Be), bismuth (Bi), cobalt (Co), Cu, hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), W, zinc (Zn), or zirconium (Zr).

The conductive barrier layer may include at least one of W, WN, WC, Ti, TIN, Ta, TaN, Ru, Co, Mn, WN, Ni, or NiB and may have a single layer or a multi-layer structure. The conductive barrier layer and the metal plug may be formed, for example, through a physical vapor deposition (PVD) process or a chemical vapor deposition (CVD) process. In one embodiment, the TSVs 135 may be surrounded by a spacer insulating layer, for example, a spacer insulating layer 136 as illustrated in FIG. 3A. The spacer insulating layer 136 may prevent the electronic devices of the image sensor 100 and the TSVs 135 from directly contacting one another. The spacer insulating layer 136 may be formed, for example, of an oxide layer, a nitride layer, a carbide layer, polymer, or a combination thereof.

A protective layer 132 may be formed at the second surface 100B of the image sensor 100. The protective layer 132 may have an opening through which the conductive pads 130 are exposed and may be formed, for example, of an oxide layer, a nitride layer, or a combination thereof.

In FIG. 2B, the TSVs 135 have a structure that passes through the image sensor 100 to electrically connect the conductive pads 130, respectively formed at the first surface 100A and the second surface 100B of the image sensor 100, to one another.

FIG. 3A illustrates a cross-sectional view of an embodiment in which the image sensor chip 10 and the logic chip 20 of the image sensor package 1 are combined with each other. FIG. 3A is an enlarged view illustrating an example partial configuration of the image sensor chip 10 and an example partial configuration of the logic chip 20.

Referring to FIG. 3A, the image sensor chip 10 may be mounted on the logic chip 20. The image sensor 100 may include a sensor substrate 110. The sensor substrate 110 may be formed of a semiconductor or compound semiconductor. For example, the sensor substrate 110 may include silicon (Si), germanium (Ge), silicon carbide (SiC), gallium arsenide (GaAs), indium arsenide (InAs), or indium phosphide (InP). The sensor substrate 110 may include a conductive region, for example, a well in which an impurity is doped, or a structure doped with an impurity. Also, the sensor substrate 110 may have various isolation structures, e.g., a shallow trench isolation (STI) structure, a deep trench isolation (DTI) structure, etc.

A plurality of unit pixels in the image sensor 100 may include a photodiode PD as a photosensitive device, a transfer transistor TX, a reset transistor, a drive transistor, and a selection transistor corresponding to a readout circuit.

The photodiode PD may receive light (for example, visible rays or infrared rays) from the outside and may produce photocharges based on the received light. The photocharges produced by the photodiode PD may be transferred to a floating diffusion region FD via the transfer transistor TX. When the transfer transistor TX is turned on, photocharges produced by the photodiode PD may be transferred to the floating diffusion region FD via the turned-on transfer transistor TX. The image sensor 100 may be, for example, a backside illuminated image sensor (BIS) that generates a pixel signal based on incident light through the first surface 100A that is a backside of the sensor substrate 110.

In the image sensor 100, a plurality of gate structures may be formed at a frontside 100F of the sensor substrate 110. The gate structures may transmit and amplify electrical signals (e.g., photocharges) corresponding to incident light. The color filter 125 and the micro-lenses 150 may be formed at the first surface 100A of the image sensor 100 and may provide incident light to the photodiode PD.

The photodiode PD may be formed in the sensor substrate 110 and may produce photocharges corresponding to incident light. The photodiode PD generates electron-hole pairs corresponding to incident light and collects these electrons or holes respectively. The photodiode PD may have a structure doped with a different type of an impurity (for example, an n-type impurity) from the impurity doped onto the sensor substrate 110. The transfer transistor TX may transfer the photocharges produced by the photodiode PD to the floating diffusion region FD in the sensor substrate 110. The floating diffusion region FD may receive the photocharges from the transfer transistor TX. A pixel signal of the image sensor 100 may be generated based on a charge quantity of the photocharges transferred to the floating diffusion region FD.

The reset transistor of the image sensor 100 may receive a reset signal. When the reset signal is activated, the charges accumulated in the floating diffusion region FD are discharged to reset the floating diffusion region FD.

The color filter 125 may be at a position corresponding to the photodiode PD of the first surface 100A of the sensor substrate 110.

The micro-lenses 150 may be at a position corresponding to the photodiode PD on the color filter 125. The micro-lenses 150 may adjust a path of incident light to concentrate the incident light on the micro-lenses 150 on the photodiode PD.

An anti-reflective layer 115 may be between the sensor substrate 110 and the color filter 125. The anti-reflective layer 115 may prevent incident light from being reflected at the first surface 100A of the image sensor 100. The anti-reflective layer 115 may be formed when different materials with different reflective indexes are alternately stacked a plurality of times.

An interlayer insulating layer 160 may be on the frontside 100F of the sensor substrate 110 and may cover a plurality of gate structures. The interlayer insulating layer 160 may have a multi-layer structure. The interlayer insulating layer 160 may be formed, for example, of an oxide. The interlayer insulating layer 160 may insulate the interconnection structures 170 that are electrically connected to gate structures from one another. The interconnection structures 170 may include, for example, a metal such as Cu or W. The TSVs 135 that pass through the image sensor chip 10 may be formed to be electrically connected to the interconnection structures 170. As illustrated in FIG. 3A, the TSVs 135 may be connected to other TSVs 137 that are electrically connected to the interconnection structures 170.

The logic chip 20 may include a logic substrate 210 and an interconnection structure 220 formed on the logic substrate 210.

The interconnection structure 220 may include a plurality of logic gate structures 228, an interlayer insulating layer 226 that covers the logic gate structures 228 on the logic substrate 210, and a plurality of interconnection layers 224 insulated from one another by the interlayer insulating layer 226. The interlayer insulating layer 226 may have a multi-layer structure. The interconnection layers 224 may include a plurality of interconnection layers 224A that extend parallel to the logic substrate 210 and a contact plug 224B for connecting part of the interconnection layers 224A. Various logic circuits may be configured by the plurality of interconnection layers 224 in the interconnection structure 220.

The logic circuits include, for example, a processor core intellectual property (IP), an ADC, a digital-to-analog converter (DAC), a phase-locked loop (PLL), and/or other circuits. The interconnection layers 224 may be formed, for example, of Cu, Al, or W. In one embodiment, the interlayer insulating layer 226 may be formed, for example, of a silicon oxide, a silicon nitride, or a combination thereof.

An insertion layer 28 may be between the image sensor chip 10 and the logic chip 20 and may electrically connect the image sensor chip 10 to the logic chip 20. The insertion layer 28 may include a connection part 282 that electrically connects the image sensor chip 10 to the logic chip 20 and an insulating layer 284. The connection part 282 may be formed of a metal, e.g., Cu or W. The connection part 282 may pass through the insulating layer 284. The connection part 282 may include a first connection part 282A and a second connection part 282B. The insulating layer 284 may include a first insulating layer 284A that surrounds the first connection part 282A and a second insulating layer 284B that surrounds the second connection part 282B. In some embodiments, the conductive pads 130 in FIG. 2B may be part of the connection part 282 in FIG. 3A, and the protective layer 132 in FIG. 2B may be part of the insulating layer 284 in FIG. 3A.

FIG. 3B illustrates an embodiment of a pixel array PA of the image sensor chip 10 and a signal processor SP of the logic chip 20 in the combined structure of the image sensor chip 10 and the logic chip 20 in FIG. 3A.

Referring to FIGS. 3A and 3B, the pixel array PA may include a plurality of unit pixels in the sensor array region (e.g., SAR in FIG. 2A) of the image sensor chip 10.

The signal processor SP may provide various driving signals to the image sensor chip 10 to drive the pixel array PA. Electrical signals, which are converted from incident light in the pixel array PA of the image sensor chip 10, may be provided to the SP of the logic chip 20. The SP may process the electrical signals from the pixel array PA of the image sensor chip 10 to generate image data. The SP may include a row driver 25, a correlated double sampler (CDS) 26, an ADC, and a timing controller 27.

The row driver 25 may be connected to each row of the pixel array PA and may generate a driving signal for driving the pixels in each row. For example, the row driver 25 may drive the unit pixels in the pixel array PA in row units.

The CDS 26 may obtain a difference between a reference voltage indicating a reset state of the unit pixels and an output voltage indicating a signal component corresponding to incident light using a capacitor, a switch, etc., to perform correlated double sampling. The CDS 26 may output an analog sampling signal corresponding to the effective signal component. In one embodiment, the CDS 26 may include a plurality of correlated double sampler circuits respectively connected to column lines of the pixel array PA and may output an analog sampling signal corresponding to the effective signal component in each column.

The ADC may convert an analog image signal corresponding to the effective signal component to a digital image signal. The ADC may include a reference signal generator REF 29A, a comparator 29B, a counter 29C, and a buffer 29D. The reference signal generator REF 29A may generate a reference signal (e.g., a lamp signal) having a predetermined gradient. The reference (lamp) signal may be supplied as the reference signal of the comparator 29B. The comparator 29B may compare the analog sampling signal output from the CDS 26 in each column with the lamp signal generated by the reference signal generator REF. The comparator 29B may then output comparison signals having transition times according to effective signal components. The counter 29C may perform a counting operation to generate a counting signal and may supply the counting signal to the buffer 29D. The buffer 29D may include a plurality of latch circuits respectively connected to the column lines. The counting signal may be output from the counter 29C in each column based on a transition of each comparison signal. The latched counting signal may then be output as image data.

The timing controller 27 may control operating timings of the row driver 25, the CDS 26, and the ADC. The timing controller 27 may supply a timing signal and a control signal to the row driver 25, the CDS 26, and the ADC.

Figure 4:
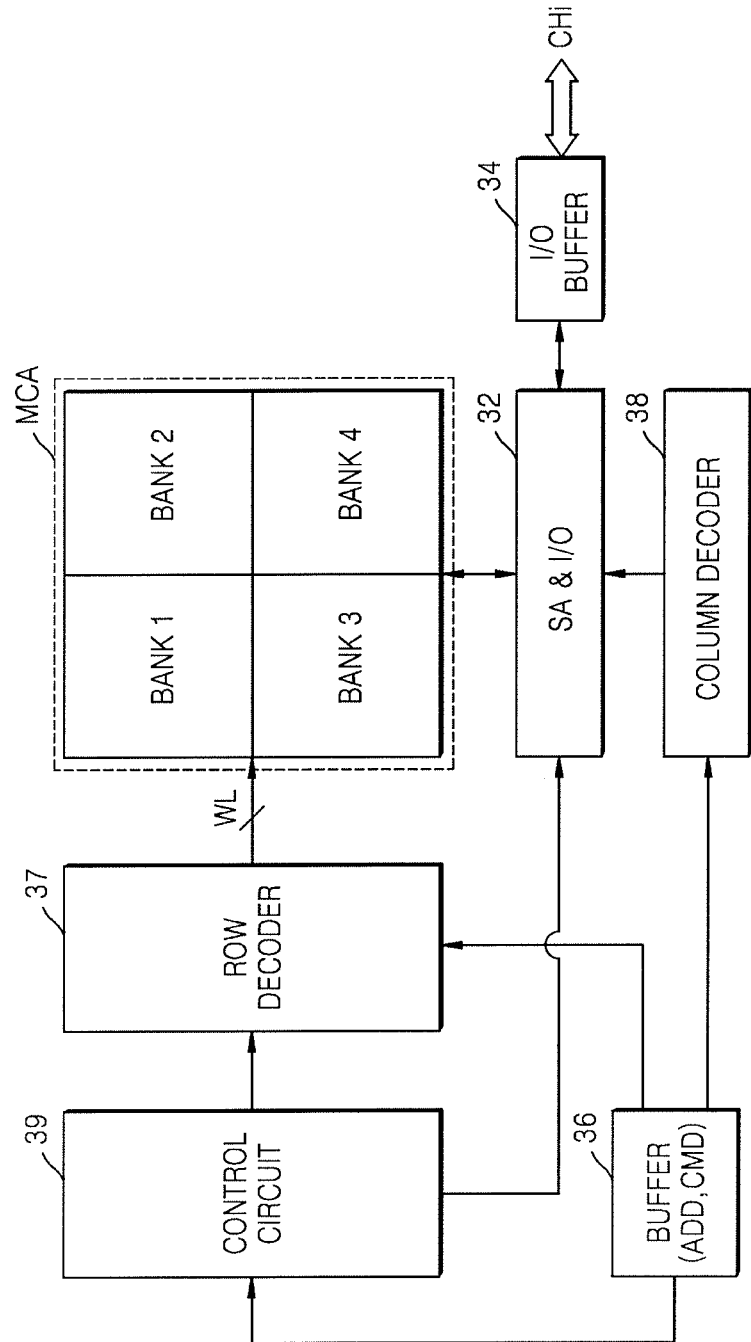
FIG. 4 illustrates an embodiment of a memory chip.

FIG. 4 illustrates an embodiment of the memory chip 30 in FIG. 1. The memory chip 30 may be, for example, a dynamic random access memory (DRAM).

Referring to FIG. 4, the memory chip 30 may include a memory cell array (MCA), a sense amp (SA) & input/output (I/O) circuit 32, an I/O buffer 34, a buffer 36, a row decoder 37, a column decoder 38, and a control circuit 39. The memory cell array MCA may include a plurality of memory cells including one access transistor and one capacitor. The memory cells may be arranged in a matrix including rows and columns. In FIG. 4, the MCA may be divided into a plurality of banks, e.g., BANK 1, BANK 2, BANK 3, and BANK 4.

The control circuit 39 may receive the control signal and an address to generate an internal control signal for controlling set operating modes. The buffer 36 may receive the address to perform buffering. The buffer 36 may supply a row address for selecting a row of the MCA to the row decoder 37 based on the internal control signal from the control circuit 39, and may supply a column address for selecting a column of the MCA to the column decoder 38. The buffer 36 may receive a command to perform buffering. The command may be applied to the control circuit 39 and decoded.

The row decoder 37 decodes the row address based on the internal control signal from control circuit 39. When the result of row address decoding is applied to the MCA, a selected wordline may be driven from among a plurality of wordlines connected to memory cells. The column decoder 38 decodes the column address based on the internal control signal. Column gating may be performed according to the decoded column address. As the result of performing column gating, a selected bitline, from among bitlines connected to the memory cells, may be driven. The SA & I/O circuit 32 may detect an electric potential in the selected bitline of the memory cell to sense data stored in the selected memory cell. The I/O buffer 34 may buffer input/output data. In a read operation mode, the I/O buffer 34 may buffer data readout from the SA & I/O circuit 32 to output the buffered data to a channel CHi.

FIG. 5 illustrates another embodiment of an image sensor package 1A. The image sensor package 1A in FIG. 5 may be an image sensor package on which the image sensor chip 10, the logic chip 20 and the memory chip 30 (e.g., as described with reference to FIGS. 1 through 4) are mounted on one package.

Referring to FIG. 5, the image sensor package 1A may include a package substrate 400, and a memory chip structure 300A, a logic chip 20, and an image sensor chip 10 sequentially stacked on the package substrate 400. The memory chip structure 300A, the logic chip 20, and the image sensor chip 10 may perpendicularly overlap an extension direction of the package substrate 400. The memory chip structure 300A may include a memory chip 30A.

An active surface of the memory chip 30A faces the package substrate 400. The memory chip 30A may be mounted on the package substrate 400, for example, through flip chip bonding. An access terminal 340 may have the shape, for example, of a solder ball as illustrated in FIG. 5. In one embodiment, the access terminal 340 may be a solder bump. In order to prevent oxidation of the access terminal 340, the access terminal 340 may have a surface treated with organic material coating or metal plating etc. The organic material coating may be organic solder preservation (OSP) coating. The metal plating may be, for example, Au, Ni, Pb, or Ag plating.

A plurality of connection pads 414 may be on a bottom surface of the package substrate 400, and a plurality of connection terminals 450 may be connected to the connection pads 414. The image sensor package 1A may be connected to an external apparatus via the connection terminals 450. The connection pads 414 may be formed, for example, of Al or Cu. The connection terminals 450 may be formed, for example, of Cu, Al, Au, or a solder.

The memory chip 30A may include a plurality of chip pads 360. The chip pads 360 may include a conductive layer exposed from the outside of the memory chip 30A. Electrical signals may be input or output from the outside of the memory chip 30A to the inside of the memory chip 30A or from the inside of the memory chip 30A to the outside of the memory chip 30A via the chip pads 360. Various numbers of chip pads 360 with different shapes may be provided in different embodiments for unit devices of memory chip 30A. The sizes of the chip pads 360 for inputting/outputting electrical signals to/from the memory chip 30A and a distance therebetween may be comparatively small. The chip pads 360 may be arranged, for example, according to the Joint Electron Device Engineering Council (JEDEC) standard, so that memory chip 30A may be applied to the package substrate 400, a module, or a system board, etc.

The memory chip 30A may be, for example, DRAM, static random access memory (SRAM), phase-change random access memory (PRAM), magnetoresistive random access memory (MRAM), ferroelectric random access memory (FeRAM), resistive random access memory (RRAM), flash memory, or electrically erasable programmable read-only memory (EEPROM).

A memory chip structure 300A may include a molding part 320 on the package substrate 400 to seal the memory chip 30A. The molding part 320 may surround the periphery of the memory chip 30A and cover side surfaces of the memory chip 30A. The molding part 320 may be formed, for example, of an epoxy resin.

The molding part 320 may have an exposed mold structure that does not cover the top surface of the memory chip 30A. For example, the top surface of the molding part 320 may be materially on the same plane as the top surface of the memory chip 30A. An adhesive layer 370 may be on the top surface of the molding part 320 and the top surface of the memory chip 30A, in order to attach the logic chip 20 onto the memory chip structure 300A.

A horizontal cross-section of the memory chip 30A may be smaller than a horizontal cross-section of the logic chip 20 and smaller than a horizontal cross-section of the image sensor chip 10. In some embodiments, each of the logic chip 20 and the image sensor chip 10 may have a horizontal cross-section with approximately the same size. As illustrated in FIG. 5, the horizontal cross-section of the memory chip structure 300A may have approximately the same size as the size of the horizontal cross-section of the logic chip 20 and the size as of the horizontal cross-section of the image sensor chip 10. However, the horizontal cross-section of the memory chip structure 300A may be larger than the horizontal cross-section of the logic chip 20 and may also be larger than the horizontal cross-section of the image sensor chip 10.

The package substrate 400 may include an interconnection layer 410. At least part of the interconnection layer 410 may function as a transfer path for a power supply voltage, a ground voltage, or signals supplied by an external apparatus. The at least part of the interconnection layer 410 may function as a signal transfer path on which an output signal of the image sensor chip 10 and/or an output signal of the logic chip 20 is transferred to the memory chip 30A. The interconnection layer 410 may be electrically connected to the memory chip 30A via the access terminal 340, and may be electrically connected to the image sensor chip 10 and the logic chip 20 via the conductive wire 50 that connects the conductive pads of the image sensor chip 10 and the bonding pads 412 on the package substrate 400.

The pixel signal output from the image sensor chip 10 may be supplied to the internal circuit of the memory chip 30A, after sequentially passing through the conductive wire 50 that connects the image sensor chip 10 to the package substrate 400, the interconnection layer 410 of the package substrate 400, and the access terminal 340. The pixel signals processed by the logic chip 20 may be supplied to the internal circuit of the memory chip 30A, after sequentially passing through the image sensor chip 10, the conductive wire 50, the interconnection layer 410 of the package substrate 400, and the access terminal 340.

The power supply voltage, the ground voltage, or the signals supplied by the external apparatus may be input to the memory chip 30A, after sequentially passing through the interconnection layer 410 of the package substrate 400 and the access terminal 340. The power supply voltage, the ground voltage, or the signals supplied by the external apparatus may be input to the image sensor chip 10, after sequentially passing through the interconnection layer 410 of the package substrate 400 and the conductive wire 50 that connects the image sensor chip 10 to the package substrate 400. The power supply voltage, the ground voltage, or the signals supplied by the external apparatus may be input to the logic chip 20, after sequentially passing through the interconnection layer 410 of package substrate 400, conductive wire 50 that connects the image sensor chip 10 to the package substrate 400, and image sensor chip 10.

Figure 6:
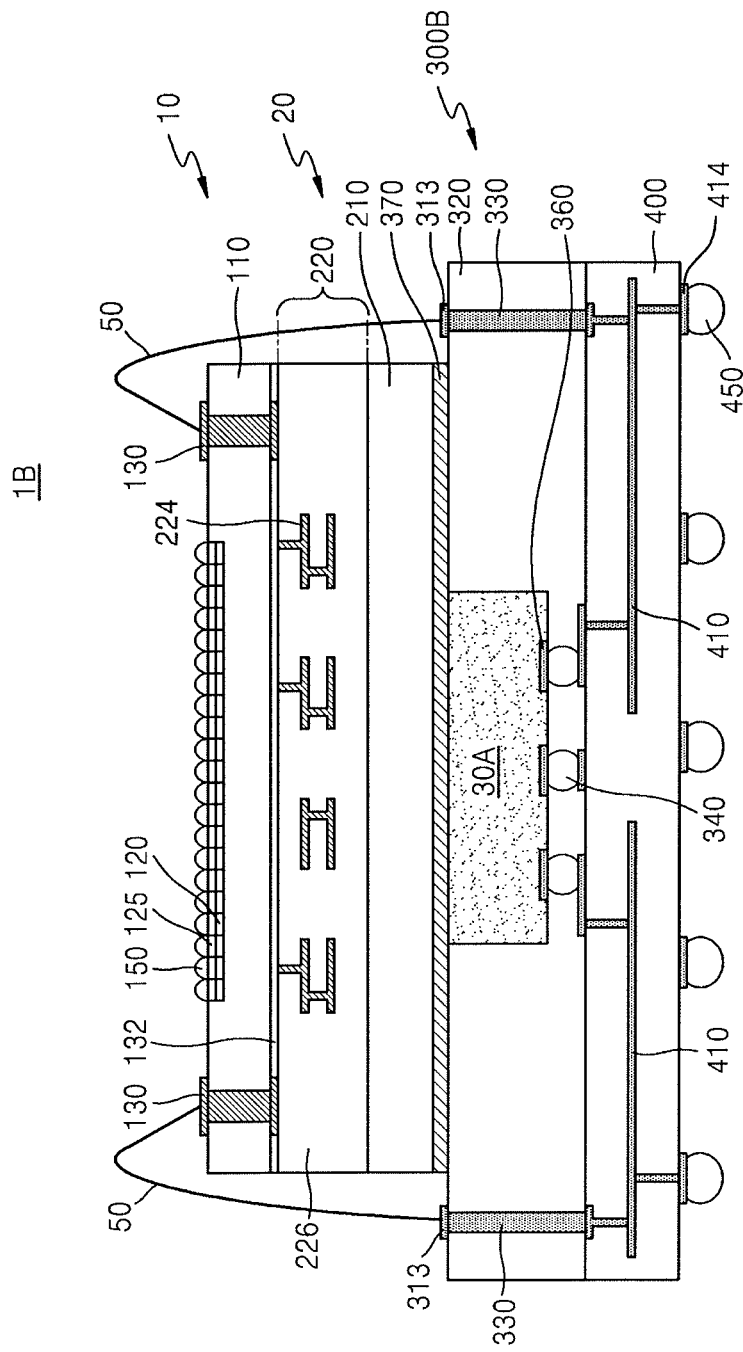
FIG. 6 illustrates another embodiment of an image sensor package.

FIG. 6 illustrates another embodiment an image sensor package 1B. Referring to FIG. 6, a horizontal cross-section of a memory chip structure 300B may be larger than a horizontal cross-section of a logic chip 20 and a horizontal cross-section of an image sensor chip 10. Bonding pads 313, to which a conductive wire 50 is connected, may be on a top surface of a molding part 320. The conductive wire 50 may connect conductive pads 130 of the image sensor chip 10 to the bonding pads 313.

The memory chip structure 300B may include through mold vias (TMVs) 330 that pass through the molding part 320 and extend vertically. The TMVs 330 may connect an interconnection layer 410 of a package substrate 400 to the bonding pads 313 on the molding part 320.

Thus, the pixel signal output from the image sensor chip 10 may be supplied to the internal circuit of a memory chip 30A, after sequentially passing through the conductive wire 50, the TMVs 330, the interconnection layer 410 of the package substrate 400, and an access terminal 340. The pixel signals processed by the logic chip 20 may be supplied to the internal circuit of the memory chip 30A, after sequentially passing through the image sensor chip 10, the conductive wire 50, the TMVs 330, the interconnection layer 410 of the package substrate 400, and the access terminal 340.

A power supply voltage, a ground voltage, or signals supplied by the external apparatus may be input to the image sensor chip 10, after sequentially passing through the interconnection layer 410 of the package substrate 400, the TMVs 330, and the conductive wire 50. The power supply voltage, the ground voltage, or the signals supplied by the external apparatus may be input to the logic chip 20, after sequentially passing through the interconnection layer 410 of the package substrate 400, the TMVs 330, the conductive wire 50, and the image sensor chip 10.

Figure 7:
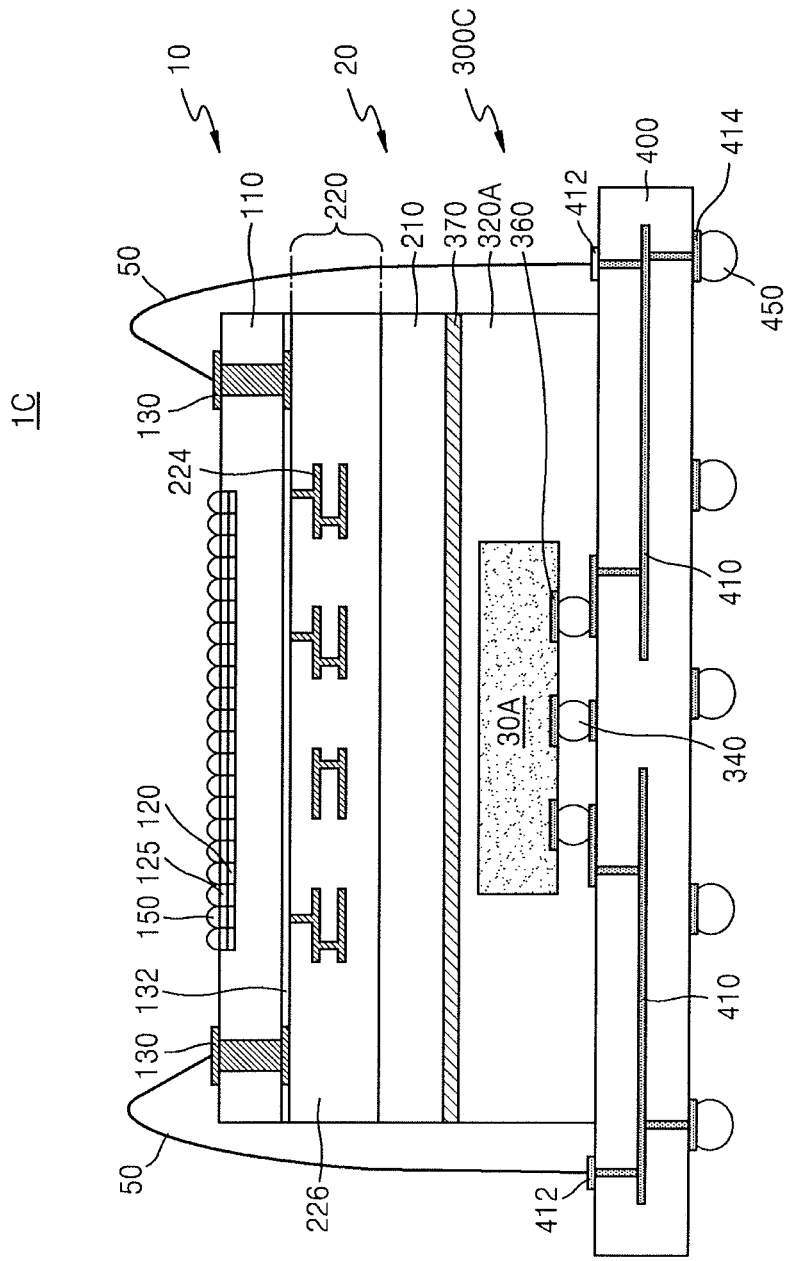
FIG. 7 illustrates another embodiment of an image sensor package.

FIG. 7 illustrates another of an image sensor package 1C. Referring to FIG. 7, a memory chip structure 300C includes a memory chip 30A and a molding part 320A, and the molding part 320A may cover different side surfaces and a top surface of a memory chip 30A. For example, the molding part 320A may have an overmold structure that covers the top surface of the memory chip 30A. As the molding part 320A covers the top surface of the memory chip 30A, the memory chip 30A may be further spaced apart from a logic chip 20 and may reduce the effect of heat generated in the logic chip 20 on the memory chip 30A.

Figure 8:
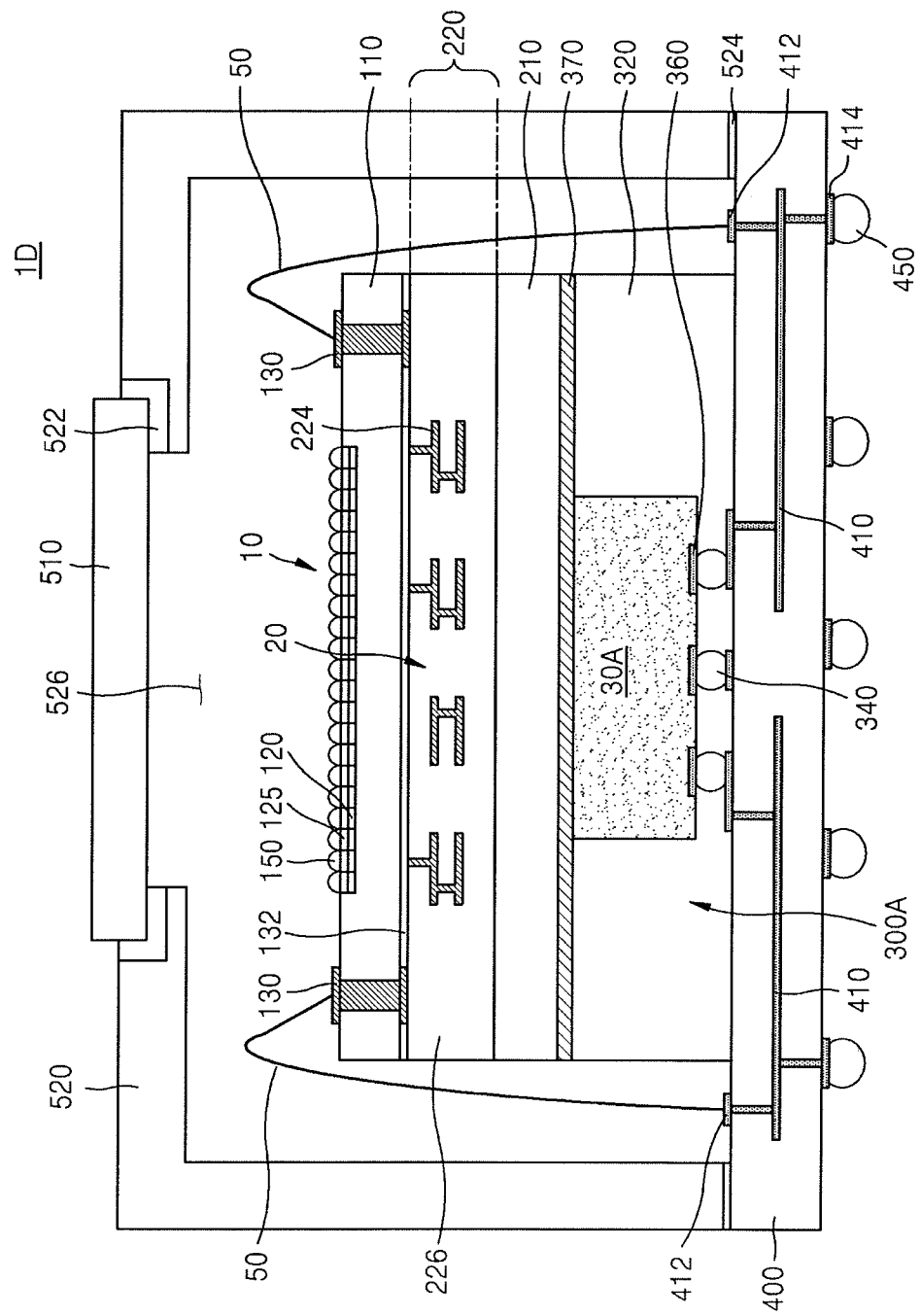
FIG. 8 illustrates another embodiment of an image sensor package.

FIG. 8 illustrates another embodiment of an image sensor package 1D. Referring to FIG. 8, a memory chip 30A, a logic chip 20, and an image sensor chip 10 on a package substrate 400 are surrounded by a holder 520 that supports a transparent cover 510. The holder 520 may be in an edge region of the package substrate 400. The transparent cover 510 may be formed of a transparent material such as glass to transmit light therethrough. The transparent cover 510 may be on the image sensor chip 10 to face a plurality of micro-lenses 150 in the image sensor chip 10, and a light-receiving space 526 may be between the image sensor chip 10 and the transparent cover 510. The transparent cover 510 may be fixed to the holder 520 using a first adhesive layer 522. The holder 520 may be fixed onto the package substrate 400 using a second adhesive layer 524.

The first adhesive layer 522 and the second adhesive layer 524 may include curable polymer. For example, the first adhesive layer 522 and the second adhesive layer 524 may include epoxy-based polymer.

In some embodiments, an internal space of the package substrate 400 surrounded by the transparent cover 510, the holder 520, the first adhesive layer 522, and the second adhesive layer 524 may be maintained in a sealed state. A region of the internal space other than the light-receiving space 526 may be filled with a mold layer.

FIG. 9 illustrates another embodiment of an image sensor package 1E. Referring to FIG. 9, a memory chip structure 300D may include a memory chip 30B and a redistribution structure 310 formed on a molding part 320. A memory chip 30B may be on a package substrate 400A, and an active surface of the memory chip 30B may face a logic chip 20. The redistribution structure 310 may extend between the memory chip 30B and the logic chip 20 and between the molding part 320 and the logic chip 20. The redistribution structure 310 may include an insulating layer 312 that covers the memory chip 30B and the molding part 320, and a plurality of redistribution layers 314 on the insulating layer 312 and connected to an interconnection structure inside the memory chip 30B. The redistribution layers 314 may be formed, for example, of W, Cu, Zr, Ti, Ta, Al, Ru, Pd, Pt, Co, Ni, each nitride thereof, or a combination thereof. The insulating layer 312 may be formed of a passivation material, for example, polyimide. The material of the insulating layer 312 may be different in another embodiment.

The redistribution layers 314 may include a redistribution pad 316 to which a conductive wire 54 is connected. Bonding pads 412 and redistribution pads 316 on the package substrate 400A may be connected to one another via the conductive wire 54. The conductive pads 130 of the image sensor chip 10 and the redistribution pads 316 may be connected to one another via a conductive wire 52.

A plurality of chip pads 360 of the memory chip 30B may be connected to the redistribution layers 314. I/O terminal interconnections of the memory chip 30B may be connected to the redistribution layers 314 via the chip pads 360.

The memory chip 30B may be connected to the image sensor chip 10 via the redistribution structure 310, and the conductive wire 52 that connects the redistribution structure 310 to the image sensor chip 10. The pixel signals output from the image sensor chip 10 may be supplied to the internal circuit of the memory chip 30B, after sequentially passing through the conductive wire 52 and the redistribution structure 310. The pixel signals processed by the logic chip 20 may be supplied to the internal circuit of the memory chip 30B, after sequentially passing through the image sensor chip 10, the conductive wire 52, and the redistribution structure 310.

The memory chip 30B may be connected to the package substrate 400A via the redistribution structure 310, and the conductive wire 54 that connects the redistribution structure 310 to the package substrate 400A. The power supply voltage, the ground voltage, or the signals supplied by the external apparatus may be input to the memory chip 30B, after sequentially passing through the conductive wire 54 that connects the redistribution structure 310 to the package substrate 400A, and the redistribution structure 310. Also, the power supply voltage, the ground voltage, or the signals supplied by the external apparatus may be input to the image sensor chip 10, via a conductive wire 50 that connects the package substrate 400A to the image sensor chip 10. In one embodiment, the power supply voltage, the ground voltage, or the signals may be input to the image sensor chip 10, after sequentially passing through the conductive wire 54 that connects the package substrate 400A to the redistribution structure 310 and the conductive wire 52 that connects the redistribution structure 310 to the image sensor chip 10.

Figure 10:
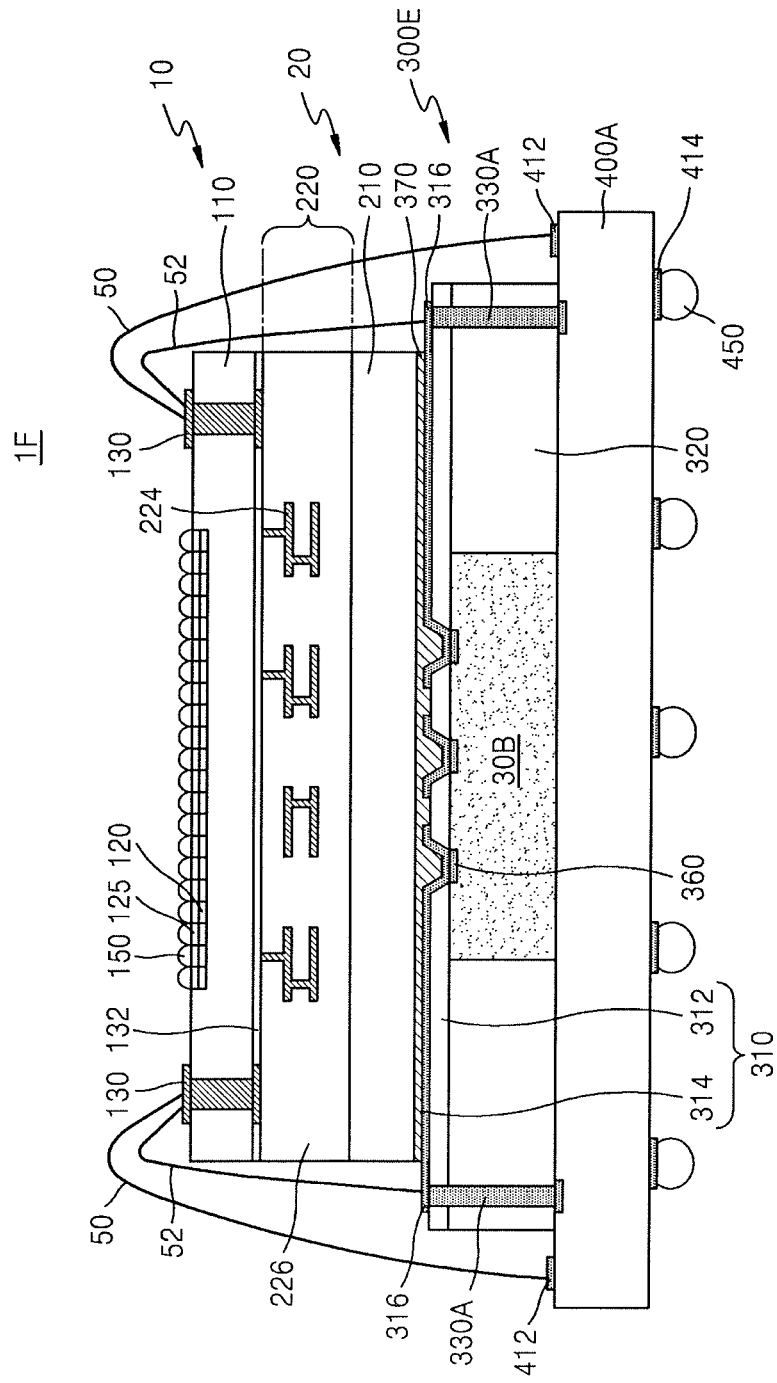
FIG. 10 illustrates another embodiment of an image sensor package.

FIG. 10 illustrates another embodiment of an image sensor package 1F. Referring to FIG. 10, a memory chip structure 300E may include TMVs 330A that pass through a molding part 320 and extend vertically. The TMVs 330A may connect interconnections of a package substrate 400A to a redistribution pads 316 of a redistribution structure 310. Thus, a memory chip 30B may be electrically connected to the package substrate 400A via the redistribution structure 310 and the TMVs 330A.

A memory chip 30B may receive a power supply voltage, a ground voltage, or signals, supplied by the external apparatus, via the TMVs 330A and the redistribution structure 310. The power supply voltage, the ground voltage, or the signals supplied by the external apparatus may be input to an image sensor chip 10, via a conductive wire 50 that connects the package substrate 400A to the image sensor chip 10. In one embodiment, the power supply voltage, the ground voltage, or the signals may be input to the image sensor chip 10, after sequentially passing through the TMVs 330A and the conductive wire 52 that connects redistribution structure 310 to image sensor chip 10.

Figure 11:
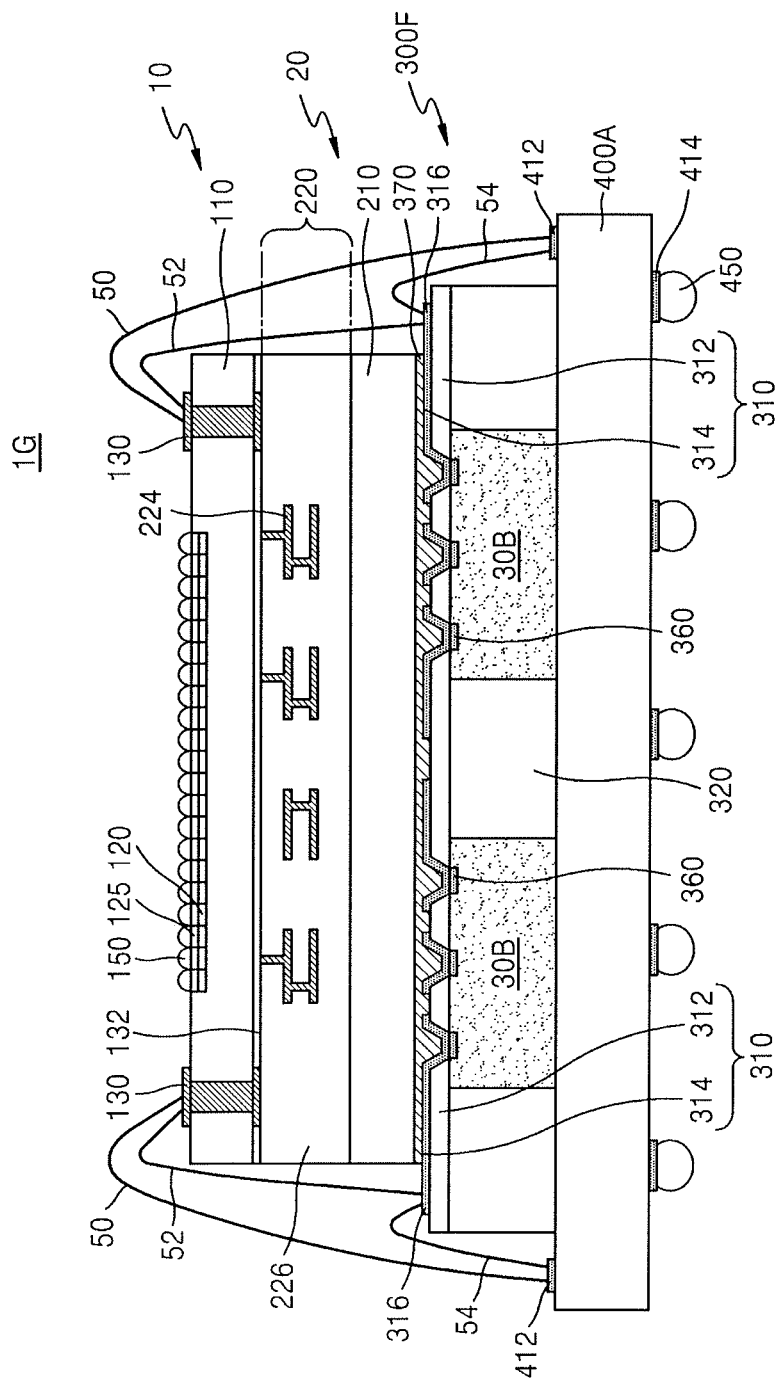
FIG. 11 illustrates another embodiment of an image sensor package.

FIG. 11 illustrates another embodiment of an image sensor package 1G. Referring to FIG. 11, a memory chip structure 300F may include a plurality of memory chips 30B on a package substrate 400A that are spaced apart from one another in a horizontal direction. Side surfaces of the memory chips 30B may be covered by the molding part 320.

The memory chip structure 300F may include a redistribution structure 310 on top surfaces of the memory chips 30B and a top surface of a molding part 320. Chip pads 360 of each of the memory chips 30B may be connected to redistribution layers 314. I/O terminal interconnections of the memory chips 30B may be connected to the redistribution layers 314 via the chip pads 360. Through a conductive wire 52 and a redistribution structure 310, the pixel signal output from an image sensor chip 10 and/or the pixel signal processed by a logic chip 20 may be transmitted to at least one of the memory chips 30B. The power supply voltage, the ground voltage, or the signals supplied by the external apparatus may be transmitted to each of the memory chips 30B via the redistribution structure 310.

Figure 12:
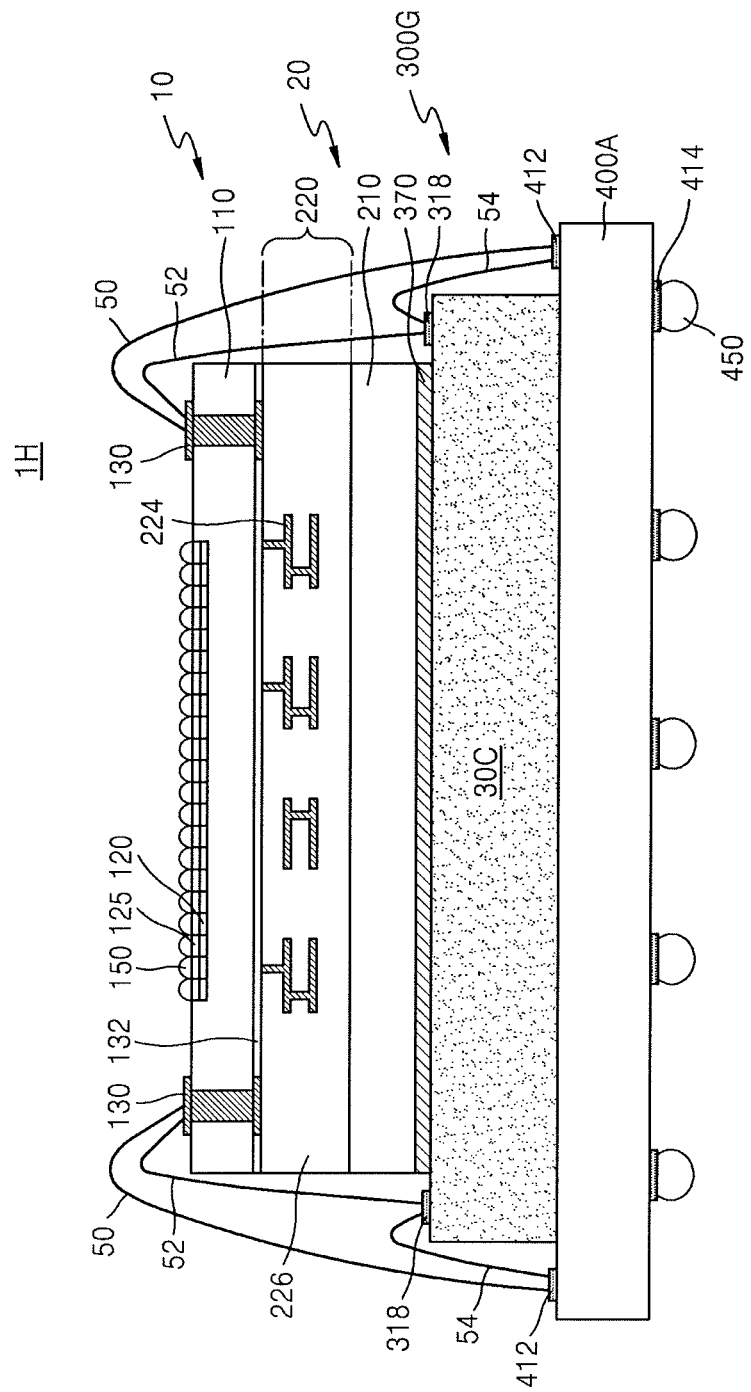
FIG. 12 illustrates another embodiment of an image sensor package.

FIG. 12 illustrates an embodiment of an image sensor package 1H. Referring to FIG. 12, a horizontal cross-section of a memory chip 30C may be larger than a horizontal cross-section of a logic chip 20 and larger than a horizontal cross-section of an image sensor chip 10. The memory chip structure 300G may include bonding pads 318 on a top surface of the memory chip 30C. The memory chip structure 300G may not include the redistribution structure 310, unlike in FIG. 9.

The memory chip 30C may be connected to the image sensor chip 10 via a conductive wire 52, having one end connected to the conductive pads 130 of the image sensor chip 10 and another end connected to the bonding pads 318 of the memory chip structure 300G. The memory chip 30C may be connected to a package substrate 400A via a conductive wire 54, having one end connected to the bonding pads 412 of the package substrate 400A and another end connected to the bonding pads 318 on the memory chip structure 300G.

Figure 13:
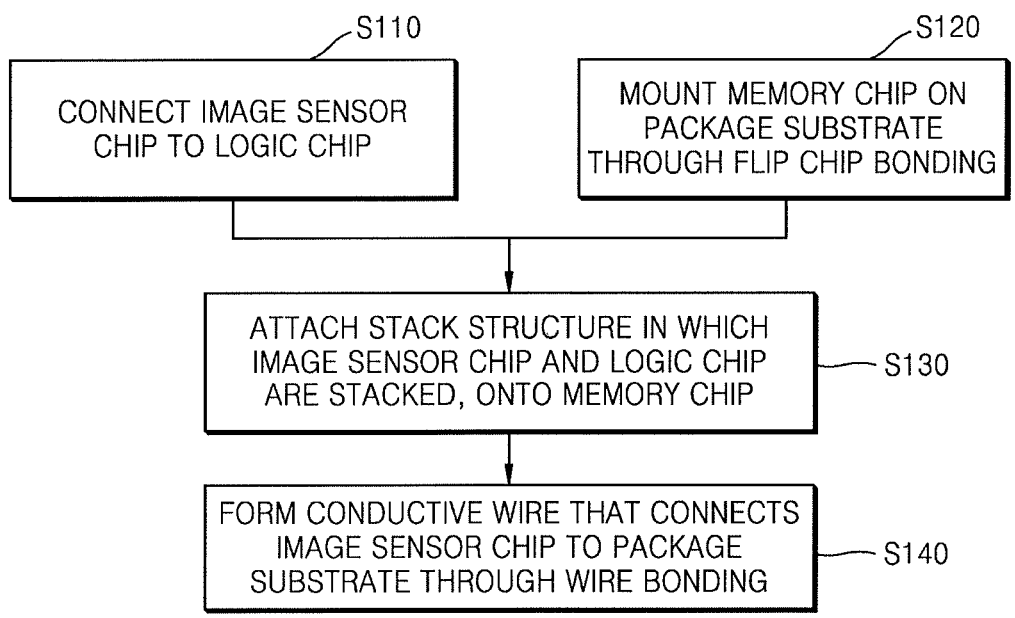
FIG. 13 illustrates an embodiment of a method for manufacturing an image sensor package.

FIG. 13 illustrates an embodiment of a method for manufacturing an image sensor package. For illustrative purposes, the method is described for manufacturing image sensor package 1A.

Referring to FIGS. 5 and 13, an image sensor chip 10 and a logic chip 20 are prepared and connected to each other (S110). The image sensor chip 10 may be connected to the logic chip 20 by an insertion layer (e.g., 28 of FIG. 3A) therebetween. The connected image sensor chip 10 and logic chip 20 may have one-stack structure. For example, the stack structure, in which the image sensor chip 10 and the logic chip 20 are stacked, may include a plurality of dies. In the stack structure, a wafer having the image sensor chips 10 formed thereon and a wafer having the logic chips 20 formed thereon are welded to each other. Each of the dies having the image sensor chip 10 and the logic chip 20 are separated from each other, for example, by a sawing process.

A memory chip 30A is mounted on a package substrate 400 through flip chip bonding (S120). For example, the memory chip 30A may be on the package substrate 400. An active surface of the memory chip 30A may face the package substrate 400, and the memory chip 30A may be mounted on the package substrate 400, through an access terminal 340 on the package substrate 400. The package substrate 400 includes an interconnection layer 410 as in FIG. 5. The memory chip 30A may be sealed by the molding part 320 that surrounds the periphery of the memory chip 30A, The molding part 320 is formed in such a way that a part of the interconnection layer 410 is exposed to an upper portion of the package substrate 400.

A stack structure, in which the image sensor chip 10 and the logic chip 20 are stacked, is attached onto the memory chip 30A (S130). The stack structure may be attached onto the memory chip 30A and the molding part 320, for example, using a die attachment film. Subsequently, a conductive wire 50, that connects the image sensor chip 10 to the package substrate 400, is formed through a wire bonding process (S140).

In a method of manufacturing an image sensor package according to the present embodiment, a stack structure is formed to include the image sensor chip 10 and the logic chip 20. This stack structure is attached onto the memory chip 30A to form good-quality product. As a result, yield may be improved.

Figure 14:
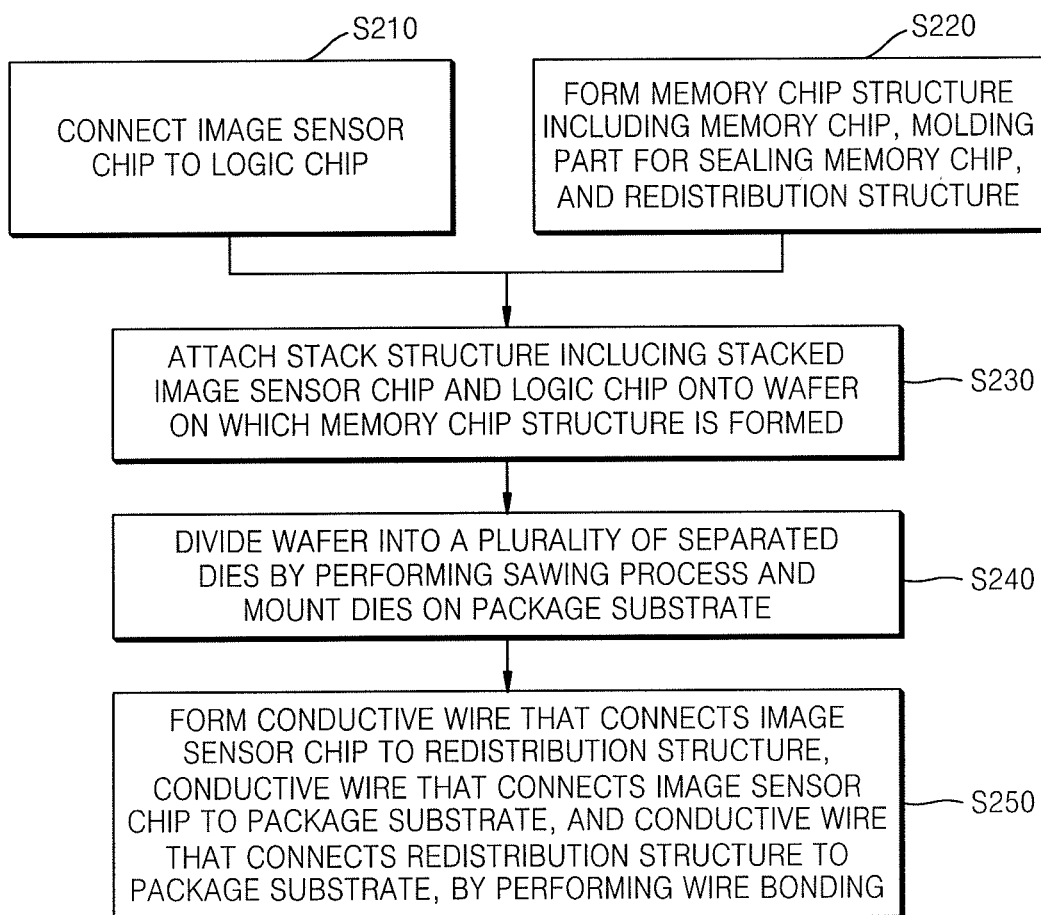
FIG. 14 illustrates another embodiment of a method for manufacturing an image sensor package.

FIG. 14 illustrates another embodiment of a method for manufacturing an image sensor package. For illustrative purposes, the method is described for manufacturing image sensor package 1E.

Referring to FIGS. 9 and 14, an image sensor chip 10 and a logic chip 20 are prepared and connected to each other (S210). A stack structure may be formed by performing operation S110 of FIG. 13, where the stack structure includes the image sensor chip 10 and the logic chip 20.

A memory chip structure 300D is formed to include a memory chip 30B, a molding part 320 that seals the memory chip 30B and a redistribution structure 310 (S220). For example, the memory chip structure 300D may be a semiconductor package having a fan out wafer level package (FOWLP) shape. For example, in the memory chip structure 300D, the molding part 320 that seals the memory chip 30B, so that the active surface of the memory chip 30B may be exposed, may be formed on a wafer on which the memory chips 30 are formed. The redistribution structure 310, including an insulating layer 312 and a redistribution layer 314 connected to the internal interconnection structure of the memory chip 30B, may be formed on top surfaces of the memory chip 30B and the molding part 320. Part of the redistribution layer 314 may include redistribution pads 316 to which a conductive wire is connected.

Next, a stack structure (in which the image sensor chip 10 and the logic chip 20 are stacked) is attached onto the wafer on which the memory chip structure 300D is formed (S230).

Subsequently, the wafer is divided into a plurality of separated dies by a sawing process, and the separated dies are mounted on the package substrate 400A (S240). The dies may include a stack structure in which the memory chip 30A, the logic chip 20 and the image sensor chip 10 are stacked.

Subsequently, a conductive wire 52 that connects the image sensor chip 10 to the redistribution structure 310, a conductive wire 50 that connects the image sensor chip 10 to the package substrate 400A, and a conductive wire 54 that connects the redistribution structure 310 to the package substrate 400A are formed by performing a wire bonding process (S250).

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The processors, controllers, drivers, comparators, counters, decoders, and other signal generating and signal processing features of the embodiments disclosed herein may be implemented in logic which, for example, may include hardware, software, or both. When implemented at least partially in hardware, the processors, controllers, drivers, comparators, counters, decoders, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the processors, controllers, drivers, comparators, counters, decoders, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An image sensor package, comprising:
a package substrate including an interconnection layer;
a memory chip on the package substrate;
a molding part surrounding the memory chip;
an access terminal bonded to both the memory chip and the package substrate, the access terminal electrically connecting the memory chip to the interconnection layer of the package substrate;
an image sensor chip on the memory chip, the image sensor chip including a conductive pad and a through silicon via;
a logic chip disposed between the image sensor chip and the memory chip, the logic chip being electrically connected to the through silicon via of the image sensor chip and configured to process a pixel signal output from the image sensor chip; and
a conductive wire attached to the conductive pad of the image sensor chip, the conductive wire electrically connecting the image sensor chip to the interconnection layer of the package substrate, wherein:
the memory chip is electrically connected to the image sensor chip through the conductive wire, the memory chip being configured to store at least one of the pixel signal output from the image sensor chip and a pixel signal processed by the logic chip,
the memory chip is configured to receive the pixel signal output from the image sensor chip through the conductive wire, and
the memory chip is configured to receive the pixel signal processed by the logic chip through the image sensor chip and the conductive wire.

2. The image sensor package as claimed in claim 1, wherein:
the image sensor chip further includes a sensor substrate and a first interlayer insulating layer under the sensor substrate, and
the through silicon via passes through the sensor substrate and the first interlayer insulating layer.

3. The image sensor package as claimed in claim 2, wherein the logic chip includes a logic substrate and a second interlayer insulating layer between the logic substrate and the first interlayer insulating layer.

4. The image sensor package as claimed in claim 1, further comprising an adhesive layer between the molding part and the logic chip.

5. The image sensor package as claimed in claim 1, wherein the molding part does not cover a top surface of the memory chip.

6. The image sensor package as claimed in claim 1, wherein the molding part covers a top surface of the memory chip.

7. The image sensor package as claimed in claim 1, wherein:
the package substrate further includes a bonding pad, and
the conductive wire extends from the conductive pad of the image sensor chip to the bonding pad of the package substrate.

8. The image sensor package as claimed in claim 1, further comprising a through mold via passing through the molding part, wherein:
the conductive wire extends from the conductive pad of the image sensor chip to the through mold via, and
the through mold via electrically connects the conductive wire to the interconnection layer of the package substrate.

9. The image sensor package as claimed in claim 1, wherein:
the interconnection layer of the package substrate connects the conductive wire to the access terminal, the memory chip is electrically connected to the image sensor chip via the conductive wire and the interconnection layer of the package substrate, and
the memory chip is electrically connected to the logic chip via the image sensor chip, the conductive wire, and the interconnection layer of the package substrate.

10. The image sensor package as claimed in claim 9, wherein the memory chip is configured to receive a power supply voltage, a ground voltage, or a signal from an external apparatus via the interconnection layer of the package substrate.

11. The image sensor package as claimed in claim 10, wherein the logic chip is configured to receive a power supply voltage, a ground voltage, or signals from an external apparatus via the image sensor chip.

12. The image sensor package as claimed in claim 1, further comprising a transparent cover on the image sensor chip; and
a holder attached on the package substrate and supporting the transparent cover.

13. An image sensor package, comprising:
a package substrate including an interconnection layer;
a memory chip on the package substrate;
a molding part surrounding the memory chip;
an access terminal bonded to both the memory chip and the package substrate, the access terminal electrically connecting the memory chip to the interconnection layer of the package substrate;
an image sensor chip on the memory chip, the image sensor chip including a conductive pad and a through silicon via;
a logic chip disposed between the image sensor chip and the memory chip, the logic chip being electrically connected to the through silicon via of the image sensor chip; and
a conductive wire attached to the conductive pad of the image sensor chip, wherein the image sensor chip is electrically connected to the memory chip through the conductive wire and the interconnection layer of the package substrate.

14. The image sensor package as claimed in claim 13, wherein:
the image sensor chip further includes a sensor substrate and a first interlayer insulating layer under the sensor substrate, the through silicon via passing through the sensor substrate and the first interlayer insulating layer, and
the logic chip includes a logic substrate and a second interlayer insulating layer provided between the logic substrate and the first interlayer insulating layer.

15. The image sensor package as claimed in claim 13, wherein:
the conductive wire extends laterally beyond a lateral periphery of the image sensor chip, and
one end of the conductive wire is connected to the conductive pad and another end of the conductive wire is connected to a bonding pad of the package substrate.

16. The image sensor package as claimed in claim 13, further comprising a through mold via passing through the molding part, wherein:
the conductive wire extends laterally beyond a lateral periphery of the image sensor chip, and
one end of the conductive wire is connected to the conductive pad and the other end of the conductive wire is connected to the through mold via.

17. The image sensor package as claimed in claim 16, wherein:
the molding part includes a protruding portion protruding laterally from a side surface of the logic chip, and
the through mold via is in the protruding portion of the molding part.

18. The image sensor package as claimed in claim 13, wherein the interconnection layer connects the conductive wire to the access terminal.

19. The image sensor package as claimed in claim 13, wherein:
the memory chip is configured to receive a power supply voltage, a ground voltage, or a signal from an external apparatus via the interconnection layer of the package substrate, and the logic chip is configured to receive a power supply voltage, a ground voltage, or signals from the external apparatus via the image sensor chip.

20. The image sensor package as claimed in claim 13, wherein the memory chip is configured to receive a signal from the image sensor chip through the interconnection layer of the package substrate.

* * * * *